Nov. 7, 1967 B. R. DOW ET AL 3,351,865
OPERATIONAL AMPLIFIER
Filed April 1, 1964
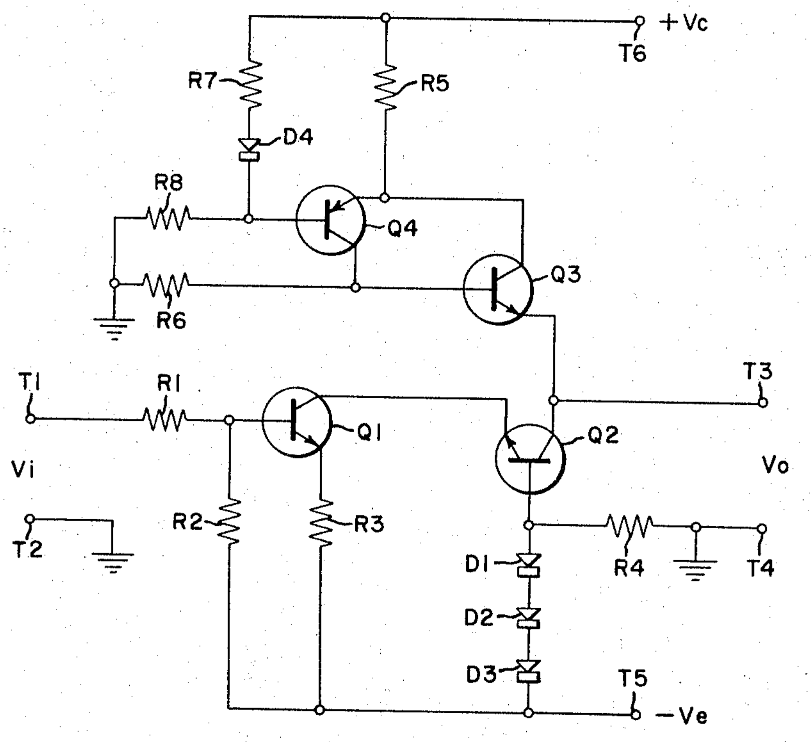
WITNESSES:
John G. Chopp
James F. Young
INVENTORS
Bruce R. Dow and
Richard A. Johnson
BY
[signature]

3,351,865
OPERATIONAL AMPLIFIER
Bruce R. Dow, Franklin Township, and Richard A. Johnson, Monroeville, Pa., assignors to Westinghouse Electric Corporation, Pittsburgh, Pa., a corporation of Pennsylvania
Filed Apr. 1, 1964, Ser. No. 356,587
5 Claims. (Cl. 330—9)

The present invention relates to amplifier circuits, and more particularly to transistor operational amplifiers meeting predetermined requirements.

An operational amplifier is required to provide an output voltage proportional to its input signals and of opposite polarity with respect to the input signals. Frequently, it is also necessary that the range of output voltages capable of being supplied by the operational amplifier be nearly equal to the sum of the power supply or biasing voltages. Because of these factors, the output transistor of the operational amplifier must meet the following requirements: First, it must have the ability to dissipate substantially more power than that delivered to the load. Second, it must be capable of operation over a large range of collector voltages, which compromises its gain-bandwidth performance. Third, the collector-emitter breakdown voltage of the output transistor must at least equal the sum of the positive and negative power supply voltages. These requirements impose upon a single output transistor conditions which presently known transistors are incapable of achieving to provide desired operation. Multiple transistor operational amplifier circuits have been devised in attempts to meet the requirements. However, most of these are complicated and expensive or impose extreme conditions on the output transistors ending in a compromised design to permit operation within the breakdown voltage and power rating of the transistors.

It is therefore an object of the present invention to provide a new and improved transistor operational amplifier.

It is a further object of the present invention to provide a new and improved transistor operational amplifier having high frequency, wide bandwidth characteristics.

It is a further object of the present invention to provide a new and improved transistor operational amplifier having short circuit protection incorporated therein.

Broadly, the present invention provides a transistor operational amplifier in which transistors are connected in a cascode connection to provide high frequency, wide bandwidth characteristics. A combination transistor having enhanced characteristics, is connected in the output to permit high frequency and high power operation.

These and other objects and advantages of the present invention will become more apparent when considered in view of the following specification and drawings, in which:

A single figure is a schematic diagram showing the operational amplifier of the present invention.

Referring to the figure, the operational amplifier is shown as a four terminal device having a pair of input terminals T1 and T2 to which input signals V*i* are applied and a pair of output terminals T3 and T4 from which the output signals V*o* are taken. The input signals V*i* are high frequency signals in the order of $10^5$ cycles per second. For proper operation of an operational amplifier it is necessary that the output signals V*o* be proportional to and of the opposite polarity to the incoming signals V*i*. The input signals V*i* are applied from the terminal T1 through an input resistor R1 to the base of an NPN transistor Q1. A bias resistor R2 is connected between the base and a power supply terminal T5 to which a negative bias voltage —V*e* is applied from a power supply, not shown. An emitter-resistor R3 is connected between the emitter of the transistor Q1 and the terminal T5. An NPN transistor Q2 operative in a common base mode has its emitter electrode connected to the collector of the transistor Q1. Three diodes D1, D2 and D3 are connected in series and poled from cathode to anode, with the anode of the diode D1 connected to the base of the transistor Q2 and the cathode of the diode D3 being connected to the terminal T5. The output terminal T3 is connected to the collector of the output transistor Q2. A resistor R4 is connected between the base of the transistor Q2 and the output terminal T4, which is at ground potential. The series connection of the diodes D1, D2 and D3 bias the diode Q2 at a low voltage reference of a slightly higher potential than the negative biasing voltage —V*e*.

With the collector of the transistor Q1 connected to the emitter of the transistor Q2, the transistor Q1 will have a substantially constant collector-emitter voltage as determined by the diodes D1, D2 and D3 and the emitter-base diode of the transistor Q2. Operating under a constant collector-emitter voltage the transistor Q1 will exhibit high frequency characteristics to permit the passage of high frequency input signals V1 of the order of $10^6$. The transistor Q2 provides high frequency response in that it is operating in a common base mode. The transistors Q1 and Q2 so connected operate as a cascode connection which exhibits an overall wide bandwidth characteristic and high frequency response to permit the passage of high frequency input signals to the output terminals T3 and T4 with substantial gain.

In the output of the operational amplifier is connected a combination transistor including an NPN transistor Q3 and a PNP transistor Q4. The collector of the transistor Q3 is connected to the emitter of the transistor Q4 and the collector of the transistor Q4 is connected to the base of the transistor Q3. The transistor combination functions as a single PNP transistor having a forward current transfer ratio of approximately the product of the current gains of the two transistors Q3 and Q4. A resistor R5 is connected between a terminal T6 to which a positive bias potential +V*c* is applied from a positive power supply, not shown, and the emitter of the transistor Q4 and the collector of the transistor Q3. The emitter resistor R5 provides DC degeneration so that constant current is maintained in transistor Q3. A resistor R6 is connected between the collector of the transistor Q4 and ground to improve the transient response of the output of the operational amplifier by discharging the collector-base capacitance of the transistor Q3 for positive going transients. The cathode of a diode D4 is connected to the base of the transistor Q4 with its anode connected through a resistor R7 to the terminal T6 at the positive bias potential +V*c*. The function of the diode D4 is to compensate for temperature variations of the base-emitter voltage of the transistor Q4. A resistor R8 is connected between the base of the transistor Q4 and ground to function with the resistor R7 and the diode D4 as a voltage divider to bias the transistors Q4 and Q3.

If incoming signals of a positive polarity are applied across the input terminals T1 and T2 they are somewhat attenuated by the input resistor R1 and then applied to the base of the input NPN transistor Q1. The transistor Q1 is rendered more conductive, until saturation of the transistor Q2, with increasing positive polarity input signals. Transistor Q1 operates at substantially constant collector-emitter voltage in that its collector electrode is connected to the emitter electrode of the NPN output transistor Q2. The output transistor Q2 operating in a common base mode with its base electrode being biased slightly above the negative bias voltage —V*e* by the diodes D1, D2 and D3. The transistors Q3 and Q4 operate as a combination PNP transistor and together act as a current source to provide a constant source of current at the collector electrode of the output transistor Q2. The PNP transistor Q4 need not be capable of handling high power and is required only to meet the high frequency and high voltage requirements of the circuit. It is not necessary that the transistor Q4 be a high power transistor in that very little power is dissipated therein because of the constant bias provided by the voltage divider including the resistors R7, R8 and the diode D4. By connecting the collector and emitter electrodes and the base and collector of the transistors Q3 and Q4, respectively, the combination appears as a high frequency and high power PNP transistor. Such high frequency and high power PNP transistors are presently not available. The NPN transistors Q3 is required to be of high frequency and high power; however, NPN transistors meeting these requirements are presently available. Thus, the constant current source of the transistors Q3 and Q4 permits a constant current to be applied to the collector of the transistor Q2. The current gains of the transistors Q3 and Q4 can be relatively poor in that they are so connected that the overall current gain is the product of the current gains of each of the transistors. Thus, an individual current gain of only 10 will produce an output current gain of 100 for the combination.

For incoming positive amplitude signals, the output voltage at the terminal T3, at the collector of the transistor Q2, will be of a negative polarity with respect to ground. As the amplitude of the incoming signals applied to the terminal T1 increases the transistors Q1 and Q2 will eventually be driven into saturation, at this point, the output potential at the terminal T3 will be at substantially the negative bias potential $-Ve$. The current provided by the transistor combination Q3–Q4 will be divided between the transistors Q2 and Q1 and the load, not shown, connected across the output terminals T3 and T4. With the incoming signals of a high positive polarity most of the current will be shunted away from the load through the transistors Q2 and Q1 so that a negative potential appears at the terminal T3.

When incoming signals of the negative polarity are applied to the terminal T1, the transistor Q1 and the transistor Q2 will be rendered less conductive and thus will present a higher impedance to the current source of the transistors Q3 and Q4. Thus, more current supplied by the transistors Q3 and Q4 will be supplied to terminal T3 and the load so that a positive voltage will appear at the terminal T3, with respect to the ground terminal T4. If the transistor Q2 is rendered completely non-conductive the positive potential appearing at the terminal T3 will approach the positive bias potential $+Vc$ with all of the current supplied by the transistor combination Q3–Q4 being supplied to the terminal T3, with a substantially short path being provided through the transistor Q3.

The output signals of the operational amplifier will thus be proportional to the incoming signals and of the opposite polarity with respect to the corresponding input signals.

Inherent short circuit protection is provided for all the transistors Q1, Q2, Q3 and Q4 in case the output terminals T3 and T4 should be short circuited. Since the transistors Q3 and Q4 act as a current source, it is evident that they will continue to only supply the predetermined constant current to the shorted terminals T3 and T4. The transistors Q1 and Q2 are short circuit protected by selecting the value of the resistor R3 to permit the transistor Q1 to go into saturation upon short circuiting the output terminals T3 and T4. Thus, with the collector of the transistor Q2 at ground, the current through transistors Q2 and Q1 will be limited when the transistor Q1 goes into saturation to prevent the destruction of these transistors from over current.

The operational amplifier as described thus permits high frequency response by using the cascode connection and constant current collector load for the transistors Q1 and Q2. Moreover, it is short circuit protected and utilizes a combination transistor which overcomes the unavailability of high power and high frequency PNP transistors to provide a composite transistor which provides such a characteristic.

Although the present invention has been described with a certain degree of particularity, it should be understood that the present disclosure has been made only by way of example and that numerous changes in the details of construction and the combination and arrangement of parts and elements may be resorted to without departing from the scope spirit of the present invention.

We claim:

1. An operational amplifier operative with direct and alternating input signals and a common reference source comprising, a first transistor of a first conductivity type operative to receive said input signals including base, collector and emitter electrodes, and a combination transistor operative as a current source and having an enhanced characteristic and being of a second conductivity type, said combination transistor including a second transistor of the first conductivity type, and a third transistor of the second conductivity type, each of said second and third transistors including base, collector and emitter electrodes, with the collector and base electrodes of said second transistor operatively connected to said emitter and collector electrodes of said third transistor, respectively, the emitter electrode of said second transistor connected to the collector electrode of said first transistor, biasing means operatively connected between the base electrode of said third transistor and said common reference source, and with output signals appearing at the collector electrode of said first transistor being of the opposite polarity with respect to said input signals applied at the base electrode of said first transistor.

2. An operational amplifier operative with direct and alternating input signals and positive and negative polarity biasing sources and a common reference source, said operational amplifier comprising, a first input transistor of a first conductivity type and a second output transistor of the first conductivity type and each including base, collector and emitter electrodes, the collector and emitter electrodes of said first and second transistors respectively operatively connected to form a cascode connection, said second transistor operating in a common base mode, the cascode connection of said first and second transistors operative to provide high frequency response with respect to said input signals, and a combination transistor operative as a current source and having an enhanced characteristic and being of a second conductivity type, said combination transistor including a third transistor of the first conductivity type and a fourth transistor of the second conductivity type, each of said third and fourth transistors including base, collector and emitter electrodes, with the collector and base electrodes of said third transistor operatively connected to said emitter and collector electrodes of said fourth transistor, respectively, the emitter electrode of said third transistor connected to the collector electrode of said second transistor, biasing means operatively connected between the base electrode of said third transistor and said common reference source, and with output signals appearing at the collector electrode of said second transistor being of the opposite polarity with respect to said input signals applied at the base electrode of said first transistor.

3. An operational amplifier operative with direct and alternating input signals and positive and negative polarity biasing sources and a common reference source, said operational amplifier comprising, a first transistor and a second output transistor of a NPN conductivity type and each including base, collector and emitter electrodes, the collector and emitter electrodes of said first and second transistors respectively operatively connected to form a cascode connection, input terminal means for applying said input signals to the base electrode of said first transistor, said first transistor operative at a substantially constant collector-emitter voltage, a current limiting resistor operatively connected between the emitter electrode of said first transistor and said negative polarity biasing source, said second transistor operating in a common base mode, unidirectional biasing means operatively connected between the base electrode of said second transistor and said negative polarity biasing source to bias said second transistor at a potential slightly above that of said negative polarity biasing source, the cascode connection of said first and second transistors operative to provide high frequency response with respect to said input signals which are applied to the base electrode of said first transistor, said current limiting resistor being selected to saturate said first transistor if said output terminal means is short circuited to provide short circuit protection, and a combination transistor operative and high power and high frequency and being of a PNP conductivity type, said combination transistor including a third transistor of a NPN conductivity type and a fourth transistor of a PNP conductivity type, each of said third and fourth transistors including base, collector and emitter electrodes, with the collector and base electrodes of said third transistor operatively connected to said emitter and collector electrodes of said fourth transistor, respectively, an emitter resistor operatively connected between the emitter electrode of said fourth transistor and said positive polarity biasing source so that said third transistor operates as a constant current source, the emitter electrode of said third transistor connected to the collector electrode of said second transistor to supply a constant current thereto, a bias resistor connected between the base electrode of said fourth transistor and said common reference source, and with output signals appearing at the collector electrode of said second transistor being of the opposite polarity with respect to said input signals.

4. An operational amplifier operative with low and high frequency input signals and positive and negative polarity biasing sources and a common reference source, said operational amplifier comprising, a first input transistor of a first conductivity type and a second ouput transistor of the first conductivity type and each including base, collector and emitter electrodes, the collector and emitter electrodes of said first and second transistors respectively operatively connected to form a cascode connection, input terminal means for applying said input signals to the base electrode of said first transistor, said first transistor operative at a substantially constant collector-emitter voltage, a current limiting resistor operatively connected between the emitter electrode of said first transistor and said negative polarity biasing source, said second transistor operating in a common base mode with the base of said second transistor being operatively connected to said negative polarity biasing source to bias said second transistor, output terminal means operatively connected between the collector and base electrodes of said second transistor, the cascode connection of said first and second transistors operative to provide high frequency response with respect to said input signals, said current limiting resistor being selected to saturate said first transistor if said output terminal means is short circuited to provide short circuit protection, and a combination transistor operative as a current source and at high frequency and high power and being of a second conductivity type, said combination transistor including a third transistor of the first conductivity type and a fourth transistor of the second conductivity type, each of said third and fourth transistors including base, collector and emitter electrodes, with the collector and base electrodes of said third transistor connected to said emitter and collector electrodes of said fourth transistor, respectively, an emitter resistor operatively connected between the emitter electrode of said fourth transistor and said positive polarity biasing source so that said third transistor operates as a constant current source, the emitter electrode of said third transistor connected to the collector electrode of said second transistor, a bias resistor connected between the base electrode of said fourth transistor and said common reference source, and with output signals appearing at said output terminals being of the opposite polarity with respect to said input signals.

5. An operational amplifier operative with low and high frequency input signals and positive and negative polarity biasing sources and a common reference source, said operational amplifier comprising, a first input transistor of a NPN type and a second output transistor af a NPN type and each including base, collector and emitter electrodes, the collector and emitter electrodes of said first and second transistors respectively operatively connected to form a cascode connection, input terminal means for applying said input signals to the base electrode of said first transistor, said first transistor operative at a substantially constant collector-emitter voltage, a current limiting resistor operatively connected between the emitter electrode of said first transistor and said negative polarity biasing source, said second transistor operating in a common base mode and acting as a current source, a plurality of diodes poled in series and operatively connected between the base electrode of said second transistor and said negative polarity biasing source to bias said second transistor, output terminal means operatively connected between the collector and base electrodes of said second transistor, the cascode connection of said first and second transistors operative to provide high frequency response with respect to said input signals, said current limiting resistor being selected to saturate said first transistor if said output terminal means is short circuited to provide short circuit protection, and a combination transistor operative at high frequency and high power and being of a PNP type, said combination transistor including a third transistor of a NPN type and a fourth transistor of a PNP conductivity type, each of said third and fourth transistors including base, collector and emitter electrodes, with the collector and base electrodes of said third transistor connected to said emitter and collector electrodes of said fourth transistor, respectively, an emitter resistor operatively connected between the emitter electrode of said fourth transistor and said positive polarity biasing source so that said third and fourth transistors operate as a constant current source, a compensating diode operatively connected between said positive polarity biasing source and the base electrode of said fourth transistor to compensate temperature variations in said combination transistor, a bias resistor connected between the base of said fourth transistor and said common reference source, the emitter electrode of said third transistor connected to the collector electrode of said second transistor, and with output signals appearing at said output terminals being of the opposite polarity with respect to said input signals.

References Cited

UNITED STATES PATENTS 3,024,422 3/1962 Jansson ------------- 330—18

ROY LAKE, *Primary Examiner.*

NATHAN KAUFMAN, *Examiner.*